United States Patent [19]

Yamaguchi et al.

[11] Patent Number: 4,591,654
[45] Date of Patent: May 27, 1986

[54] SOLAR CELLS BASED ON INDIUM PHOSPHIDE

[75] Inventors: Masafumi Yamaguchi; Akio Yamamoto; Chikao Uemura, all of Mito, Japan

[73] Assignee: Nippon Telegraph and Telephone Public Corporation, Musashino, Japan

[21] Appl. No.: 631,091

[22] Filed: Jul. 16, 1984

[30] Foreign Application Priority Data

Jul. 18, 1983 [JP] Japan .................................. 58-129542
Oct. 24, 1983 [JP] Japan .................................. 58-197516
Apr. 13, 1984 [JP] Japan .................................. 59-74493

[51] Int. Cl.$^4$ .................................................. H01L 31/06
[52] U.S. Cl. ..................................... 136/252; 136/261; 136/262; 357/30
[58] Field of Search ................. 136/252, 261, 262; 357/30, 61, 63, 88, 90

[56] References Cited

U.S. PATENT DOCUMENTS 4,278,474 7/1981 Blakeslee et al. ............. 136/249 TJ
4,370,510 1/1983 Stirn .................................. 136/262

FOREIGN PATENT DOCUMENTS 58-137263 8/1983 Japan .................................. 136/252

OTHER PUBLICATIONS

A. Yoshikawa et al., Japan. J. Appl. Phys., vol. 20 (1981), Supplement 20-2, pp. 113–117.
G. W. Turner et al., "High-Efficiency InP Homojunction Solar Cells", Appl. Phys. Lett., vol. 37, pp. 400–402 (1980).

Primary Examiner—Aaron Weisstuch

[57] ABSTRACT

An InP solar cell having a p-type InP single crystal substrate having a carrier concentration of $2 \times 10^{16}$–$2 \times 10^{18}$ cm$^{-3}$, an n-type InP layer containing a dopant of at least one element selected from VIA group including S and Se disposed on said substrate with a thickness of 0.05–1 μm, said n-type InP layer having a carrier concentration of $5 \times 10^{17}$–$1 \times 10^{19}$ cm$^{-3}$, a grid electrode arranged on said n-type InP layer, and an anti-reflection coating formed on said n-type InP layer and said grid electrode. The solar cell has a high efficiency and superior radiation resistance characteristics.

22 Claims, 19 Drawing Figures

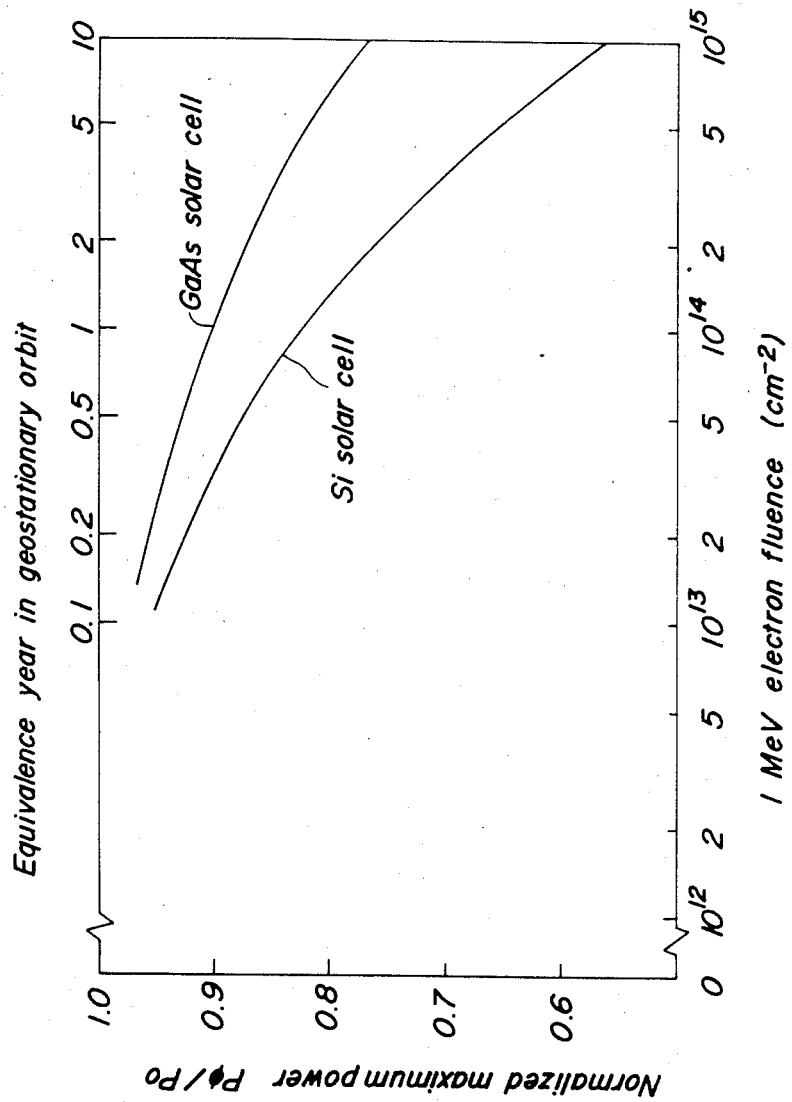

FIG_2
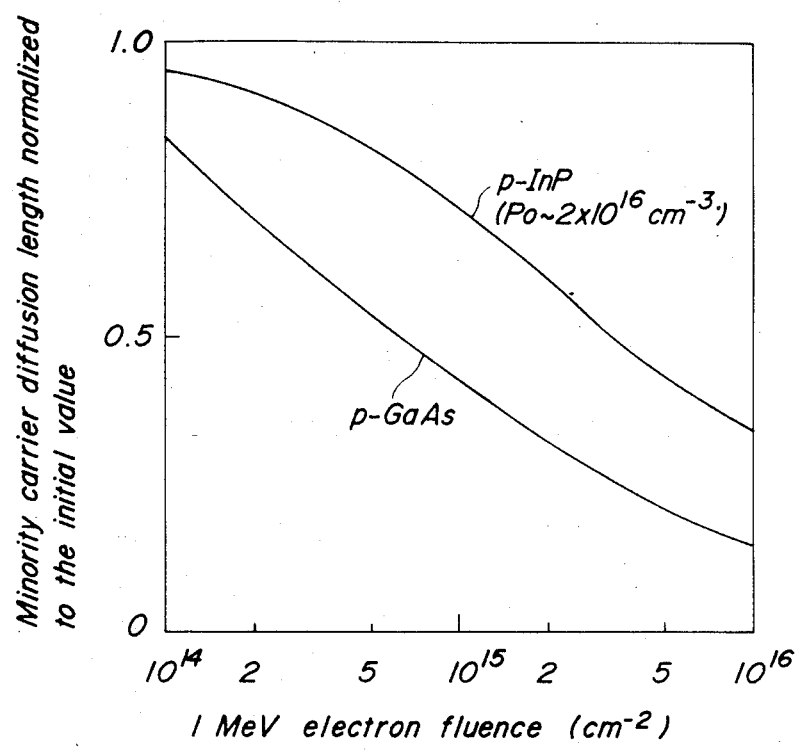

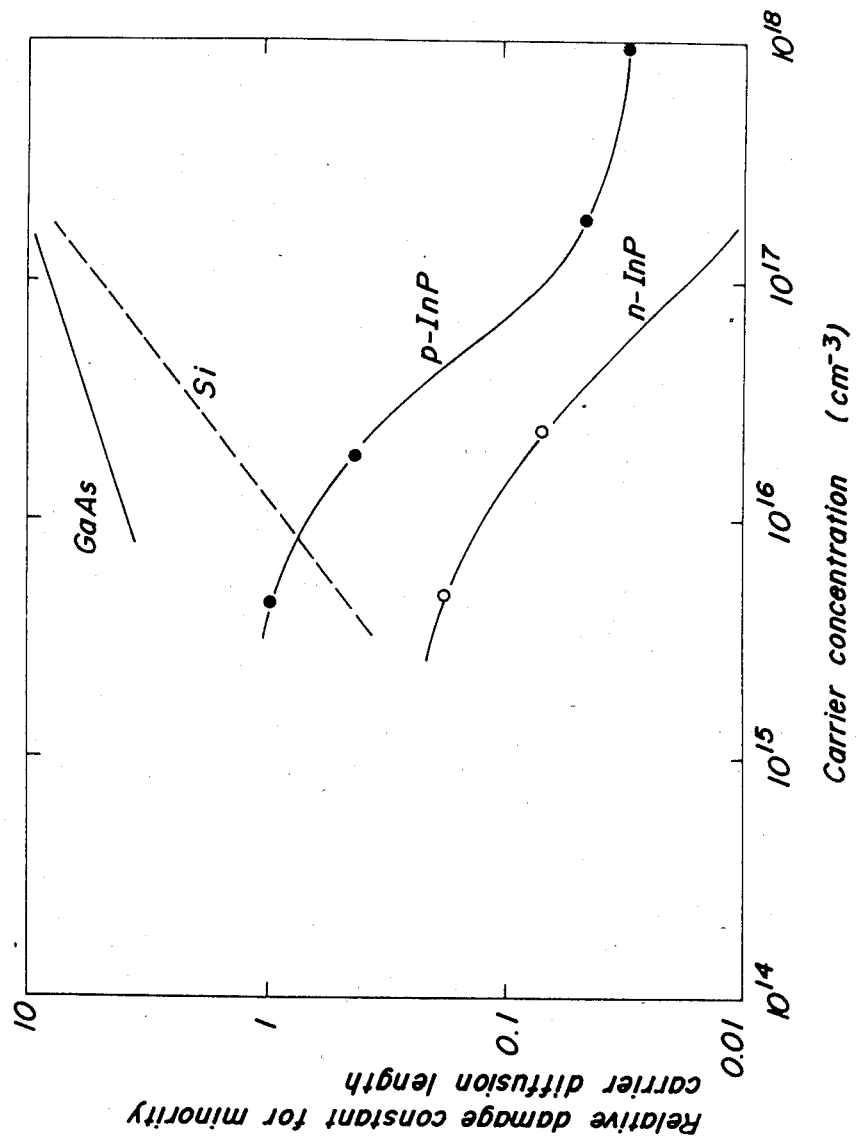

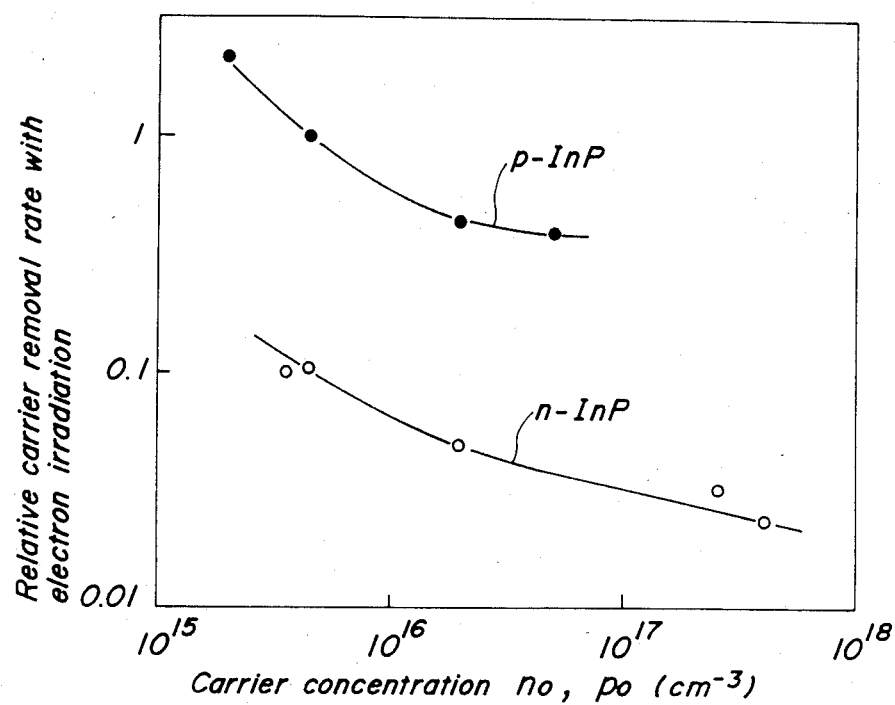
FIG_4

FIG_5
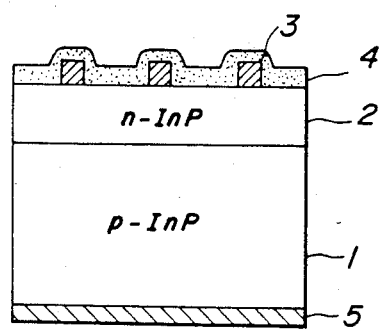
FIG_6
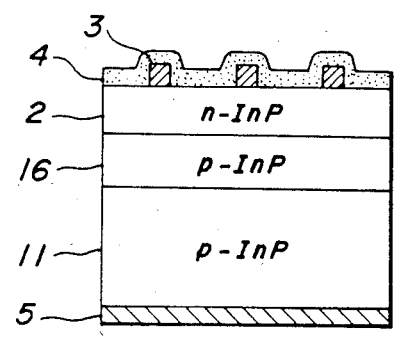
FIG_7A
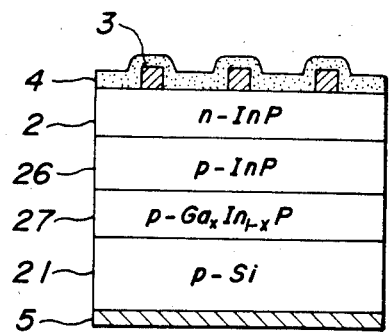

FIG_7D
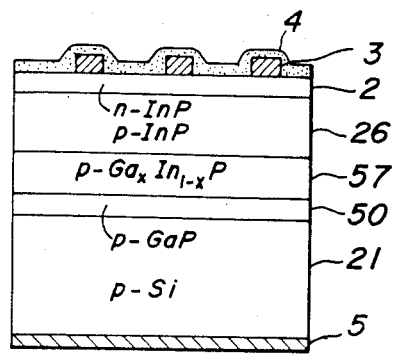
FIG_7E
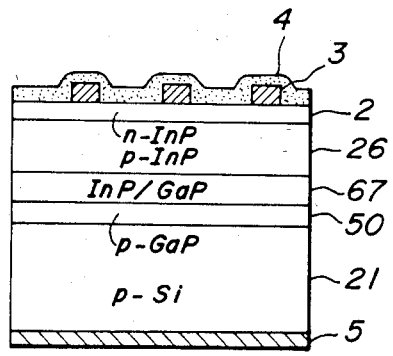

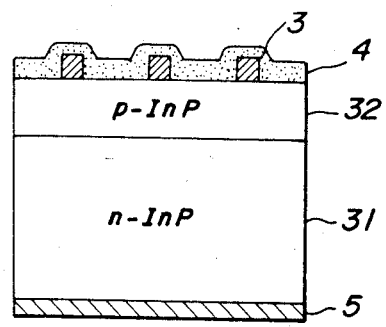
FIG_8
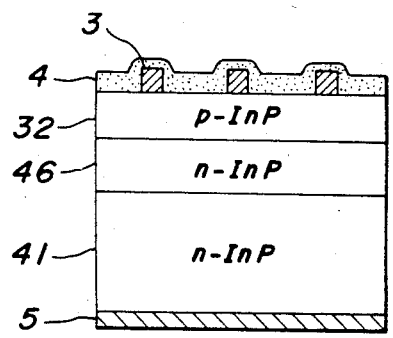
FIG_9

SOLAR CELLS BASED ON INDIUM PHOSPHIDE

BACKGROUND OF THE INVENTION

1. Field of the Invention

The present invention relates to an InP solar cell and more particularly to a high-efficiency solar cell having superior radiation-resistant characteristics.

2. Description of the Prior Art

Research is now moving forward on devices for large capacity communication satellite systems oriented toward INS (Information Network System) architecture. The high transmission capacities of those communication systems require large supplies of electrical power. Since recent artificial satellites have a life of at least 10 years, much longer than any of previous artificial satellite systems, there is a strong need for the solar cells powering these satellites to be of much higher efficiency and more long-lived. Solar cells are subject to various types of radiation in the environment of space where satellites are operated, so that such radiation causes lattice defects in semiconductors. These lattice defects result in output drops (radiation degradation) in the solar cells. Radiation degradation is decisive of the life of a solar cell.

Conventional solar cells for use in space are of the Si solar cell type. Conventional Si solar cells lack resistance to radiation degradation because the material Si is a semiconductor having an indirect bandgap.

Measures have been adopted to deal with factors in the Si solar cell such as optimizing the conductivity type and resistivity of its Si substrate layer and using antiradiation glass covers, which do reduce radiation damage. However, the life of those solar cells in the space environment is still on the order of only five years.

Solar cells using GaAs having a direct bandgap are being tested for space applications (viz., U.S. Pat. No. 4,156,310). Although GaAs solar cells represent an improvement over Si solar cells in radiation resistance, the life of the GaAs solar cell in space is estimated at about 10 years and thus is still inadequate. Furthermore, GaAs has a high surface recombination velocity, so that the GaAs solar cell requires a window layer for suppressing the influence of such a high surface recombination velocity. The addition of such a window layer means a more complicated device structure and fabrication process.

FIG. 1 shows examples of the relative changes in photoelectric power conversion efficiency due to 1 MeV electron irradiation of a conventional n+-p junction Si solar cell and a heteroface GaAs solar cell.

When a solar cell is used in the radiation environment of space, consideration should be given among particle beams to the 1 MeV electrons with a large flux. The fluence of $1 \times 10^{15}$ cm$^{-2}$ substantially corresponds to the total radiation fluence of solar cells in geostationary satellite orbit for approximately 10 years. That is to say, if the above stated solar cells are used in the space environment for approximately 10 years, the conversion efficiency of Si solar cells will be reduced to less than half and the efficiency of GaAs solar cells will be reduced to approximately 70% of their initial conversion efficiencies. Conventional Si solar cells and GaAs solar cells are deficient in their resistance to radiation degradation.

On the other hand, the theoretical conversion efficiency for InP solar cells is approximately 23% (AM0; Air Mass zero), similar to that of GaAs cells. While conversion efficiencies of 14–15% (AM2) have been obtained for CdS/InP and indium-tin-oxide (ITO)/InP heterojunction cells, only early work yielding efficiencies of approximately 2% has been reported for InP homojunction cells.

Since the crystalline structures of the CdS and InP layers on both sides of its junction differ in these heterojunction cells, crystalline defects easily arise in the junctions. In addition, because CdS is grown at high temperatures, CdS is likely to diffuse into InP and InP is likely to diffuse into CdS so that such diffusion changes the characteristics of the junction.

According to "High-efficiency InP homojunction solar cells," by G. W. Turner, et al. on pp. 400–402 of *Applied Physics Letters* Vol. 37(4), Aug. 15, 1980, the fabrication of InP homojunction cells with conversion efficiencies as high as 14.8% (AM1) is reported. The InP homojunction solar cells were formed from an n+/p/p+ structure grown by liquid phase epitaxy (LPE) on (100) oriented, p+(Zn~$1 \times 10^{18}$ cm$^{-3}$) single-crystal InP substrates. A p(Zn~$2 \times 10^{17}$ cm$^{-3}$) layer about 2 μm thick was grown first, followed by an n+(Sn~(2–5)$\times 10^{18}$ cm$^{-3}$) layer in the thickness range between 0.05 and 1.0 μm.

However, in this case, the radiation resistance and such a high conversion efficiency as 18% of GaAs cells have not been obtained and no consideration has been made of the InP homojunction solar cell for use in space.

SUMMARY OF THE INVENTION

It is, therefore, an object of the present invention to eliminate the above mentioned disadvantages and to provide a solar cell with a high efficiency and superior radiation resistant characteristics which is formed by using an InP crystal with superior radiation resistant characteristics and by optimizing carrier concentration of the substrate or the epitaxial layer and the junction depth.

In order to achieve the above objects, an InP solar cell according to the present invention comprises a p-type InP single crystal substrate having a carrier concentration of $2 \times 10^{16}$–$2 \times 10^{18}$ cm$^{-3}$, and an n-type InP layer containing a dopant of at least one element selected from group VIA including S and Se disposed on the substrate with a thickness of 0.05–1 μm.

It is preferable that the n-type InP layer has a carrier concentration of $5 \times 10^{17}$–$1 \times 10^{19}$ cm$^{-3}$.

In a second aspect of the present invention, an InP solar cell comprises a p-type semiconductor single crystal substrate, a p-type InP layer formed by epitaxial growth on the substrate and having a carrier concentration of $2 \times 10^{16}$–$2 \times 10^{18}$ cm$^{-3}$, and an n-type InP layer containing a dopant of at least one element selected from group VIA including S, Se and Te disposed on the epitaxially grown p-type InP layer with a thickness of 0.05–1 μm.

Here, it is preferable that the n-type InP layer has a carrier concentration of $5 \times 10^{17}$–$1 \times 10^{19}$ cm$^{-3}$. The p-type semiconductor single crystal substrate may be InP or Si.

In a third aspect of the present invention, an InP solar cell comprises an n-type InP single crystal substrate having a carrier concentration of $1 \times 10^{15}$–$1 \times 10^{18}$ cm$^{-3}$, and a p-type InP layer formed on the substrate and having a thickness of 0.1–2 μm.

A window layer may be provided on the p-type InP layer. The window layer may be $(Al_xGa_{1-x})_{0.47}In_{0.53}As$ ($0<x\leq 1$) or $Al_{0.47}In_{0.53}As$.

In a fourth aspect of the present invention, an InP solar cell comprises an n-type semiconductor single crystal substrate, an epitaxially grown n-type InP layer on the substrate and having a carrier concentration of $5\times 10^{14}$–$1\times 10^{18}$ cm$^{-3}$, and a p-type InP layer formed on the epitaxially grown n-type InP layer and having a thickness of 0.1–2 μm.

A window layer may be provided on the p-type InP layer. The window layer may be $(Al_xGa_{1-x})_{0.47}In_{0.53}As$ ($0<x\leq 1$) or $Al_{0.47}In_{0.53}As$.

The p-type semiconductor single crystal substrate may be InP or Si.

It is preferable that a grid electrode is arranged on the n-type InP layer. A grid electrode may be arranged on the p-type InP layer or on the window layer. An anti-reflection coating can be formed on the n-type or p-type InP layer and the grid electrode. An anti-reflection coating may be arranged on the window layer and the grid electrode. A rear surface electrode can be arranged on the rear surface of the p-type or n-type substrate.

In a fifth aspect of the present invention, an InP solar cell comprises a Si single crystal substrate, first and second InP layers forming a p-n junction which is parallel to the surface of the substrate, and a $Ga_xIn_{1-x}P$ layer ($0\leq x\leq 1$) arranged between the substrate and the first InP layer, the $Ga_xIn_{1-x}P$ layer having a GaP layer portion or a $Ga_xIn_{1-x}P$ layer portion having a high proportion of Ga on the side of the substrate and having an InP layer portion or a $Ga_xIn_{1-x}P$ layer portion having a high proportion of In on the side of the first InP layer.

Here, the composition factor x of the $Ga_xIn_{1-x}P$ layer may gradually decrease from the side of the substrate toward the first InP layer.

The $Ga_xIn_{1-x}P$ layer may be an InP/GaP superlattice layer having InP layers and GaP layers which are laminated alternately and of which the layer adjacent to the substrate is one of the GaP layers and the layer adjacent to the first InP layer is one of the InP layers.

BRIEF DESCRIPTION OF THE DRAWINGS

The present invention will be explained in detail with reference to the accompanied drawings, in which:

FIG. 1 is a graph of characteristic curves illustrating examples of radiation degradation in a conventional Si n+-p junction and a heteroface GaAs solar cell;

FIG. 2 is a graph of characteristic curves for the comparison of the radiation effects on minority carrier diffusion length in GaAs single crystal with those in the InP single crystal that forms the basis of the present invention;

FIGS. 3 and 4 are graphs of characteristic curves illustrating the effects of conductivity types and carrier concentration on the radiation effects of the InP single-crystal that forms the basis of the present invention;

FIGS. 5, 6, 7A, 7D, 7E, 8, 9, 10 and 11 are cross sectional views showing nine embodiments of structures of an InP solar cell in accordance with the present invention;

DETAILED DESCRIPTION OF THE PREFERRED EMBODIMENTS

Figure 7B:
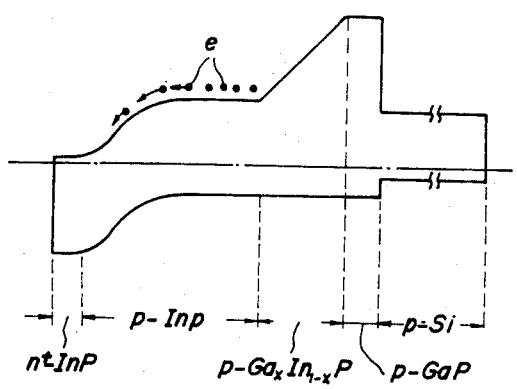
FIGS. 7B and 7C are energy band diagrams of InP solar cells according to the present invention and prior art, respectively.

It should be noted that the following explanation of the present invention is made only by way of examples and accordingly various improvements and modifications can, of course, be made within the scope of the present invention.

First, FIG. 2 illustrates the comparison between the changes in minority carrier diffusion length due to 1 MeV electron irradiation for GaAs single crystal and that for InP single crystal which is the basis of the present invention. Here, the minority carrier diffusion length is measured for the cleaved surface of a pn junction structure using the electron beam including current method (carrier concentration $p_0\sim 2\times 10^{16}$ cm$^{-3}$). The minority carrier diffusion length is important as a physical parameter that governs solar cell characteristics. Experimental results show that the drop in minority carrier diffusion length due to the irradiation is less with InP single crystal than with GaAs single crystal.

FIG. 3 shows that the relative damage constant for minority carrier diffusion length in InP single crystals is dependent upon their carrier concentrations when InP single crystals are irradiated with 1 MeV electrons, which forms the basis of the present invention. It is to be noted that in this instance as well, the minority carrier diffusion length is measured by the electron beam inducing current method. The results of the experiment show that radiation degradation is less with n-type InP single crystal than with p-type InP single crystal. The results suggest that, when an InP solar cell with a shallow junction depth is fabricated, the radiation resistance of the p+-n junction type configuration is superior to that of the n+-p junction type configuration. It is also found that there is a lesser decrease in minority carrier diffusion length for an InP single crystal with a higher carrier concentration.

FIG. 4 shows the dependence of relative carrier removal rate on carrier concentration of p- and n-type InP single crystals when they are irradiated with 1 MeV electron. According to this result, the relative carrier removal rate for n-type InP single crystal, due to the irradiation, is less than for p-type InP single crystal. It is also found that InP single crystal, with higher carrier concentration, shows the lower carrier removal rate.

That is to say, from the results of the above experiments, InP single crystal has radiation resistance characteristics superior to GaAs single crystal. It is also recognized from the experiments that the degrees of reduction in minority carrier diffusion length and carrier concentration in InP single crystal due to 1 MeV electron irradiation are dependent on the conductivity type and the carrier concentration of the InP single crystal.

The present invention takes advantage of and uses these phenomena. Through their use, experiments teach that an InP solar cell can be fabricated having a stronger resistance to radiation degradation than GaAs solar cells.

In the following, explanation will be made in detail of various embodiments of an InP solar cell in accordance with the present invention with reference to FIGS. 5, 6, 7A, 7D, 7E, 8, 9, 10 and 11.

FIG. 5 shows one embodiment of a configuration of an InP solar cell according to the present invention. Here, reference numeral 1 denotes a p-type InP single crystal substrate, on which an n-type InP layer 2 is formed by epitaxial growth or thermal diffusion process. Ohmic contacts 3 made of Au-Ge or the like having a grid pattern are formed on the n-type layer 2. Then, an anti-reflection coating 4, made of $SiO_2$, $Si_3N_4$, or the like, is applied to the surface of the n-type layer 2 covering the contacts 3. Reference numeral 5 denotes a rear surface ohmic electrode, for example, of Au-Zn, disposed on the rear side of the substrate 1. Solar light is incident from the side of the anti-reflection coating 4.

FIG. 6 shows second embodiment of a configuration of a solar cell according to the present invention. Here, a p-type InP layer 16 is epitaxially grown on a p-type InP single crystal substrate 11. The n-type InP layer 2 is epitaxially grown on the layer 16.

FIG. 7A shows a third embodiment of an InP solar cell according to the present invention. In this embodiment, a p-type $Ga_xIn_{1-x}P$ layer 27 ($0 \leq x \leq 1$) is epitaxially grown on a p-type Si single crystal substrate 21. A p-type InP layer 26 is further epitaxially grown on the p-type layer 27. Then, the n-type InP layer 2 is formed by epitaxial growth on the p-type InP layer 26. Explanation of the remaining structure of the present embodiment will be omitted, since it is the same as that in FIG. 5.

The InP single crystal substrate is more expensive than a silicon single crystal substrate and InP has a density of 4.8 g/cm$^3$, i.e., two times heavier than Si. Therefore, a solar cell having the InP substrate is expensive and heavy, i.e., disadvantageous in terms of power capacity per unit weight.

In the case of a GaAs solar cell, a silicon substrate can easily be adapted by arranging a Ge single crystal layer, which has a lattice constant substantially equal to that of GaAs, between the Si single crystal substrate and the GaAs single crystal layer. On the other hand, in the case of an InP solar cell, the difference of lattice constants between InP and Si is larger than that between GaAs and Si and there exists no semiconductor having a lattice constant substantially equal to InP, like Ge in case of GaAs, so that an InP solar cell having a silicon substrate has not been realized.

In the embodiment shown in FIG. 7A, the p-type $Ga_xIn_{1-x}P$ epitaxial layer 27 is arranged between the p-type Si substrate 21 and the p-type InP layer 26 to satisfy the above requirement. More specifically, the layer 27 has, for example, a GaP layer or a $Ga_xIn_{1-x}P$ layer having a higher composition ratio of Ga on the side of the Si substrate 21 and an InP layer or a $Ga_xIn_{1-x}P$ layer having a higher composition ratio of In on the side of the InP layer 26.

A second embodiment of this type of InP solar cell according to the present invention is shown in FIG. 7D. In FIG. 7D, a p-type GaP layer 50 is formed on the p-type Si substrate 21. A p-type $Ga_xIn_{1-x}P$ layer 57 is formed on the p-type GaP layer 50 with a composition factor x which continuously or stepwise gradually changes, as mentioned above. On the p-type $Ga_xIn_{1-x}P$ layer 57, the p-type InP layer 26 is formed.

The sequential growth of the GaP layer 50, the $Ga_xIn_{1-x}P$ layer 57, the p-InP layer 26 and the n-InP layer 2 on the p-type Si substrate 21 can suitably be processed by the metal organic chemical vapor deposition (MOCVD) method which can easily control compositions of the growing layers and has a good mass-production capability. Further, a molecular beam epitaxy method or vapor deposition method using halogen compounds may also be used with good results.

In this structure, the lattice constant (5.45 Å) of GaP is substantially equal to the lattice constant of Si (5.43 Å), so that a high quality GaP layer can be grown on the Si single crystal substrate. On the GaP layer, the $Ga_xIn_{1-x}P$ layer having a gradual change in the composition factor x between 1 and 0 is grown and finally the InP layer (x=0) is grown, so that possible lattice distortion due to the difference of the lattice constants between Si and InP is relaxed by the $Ga_xIn_{1-x}P$ layer 27 and the grown InP layer 26 is a high quality layer without defects such as mis-fit dislocations or the like.

The above mentioned composition factor x can be continuously gradually changed or continuously stepwise changed by 0.05-0.2 per step, for instance, between the p-type Si substrate 21 and the InP layer 26.

Between the p-type Si substrate 21 and the InP layer 26, there may be interposed an InP/GaP superlattice layer having about 50 very thin layers, in which thin InP layers and GaP layers, each having a thickness of about 100 Å are laminated alternately in such a manner that the thin GaP layer is positioned adjacent to the Si substrate and the thin InP layer adjacent to the InP layer 26.

An embodiment employing a superlattice is shown in FIG. 7E. In FIG. 7E, an InP/GaP superlattice layer 67 is disposed on the p-type GaP layer 50 in a manner such that very thin InP and GaP layers, each having a thickness of about 100 Å are laminated and wherein one of the very thin GaP layers is located on the p-type Si substrate 21 and one of the very thin InP layers is located on the InP layer 26. The p-type InP layer 26 is formed on the superlattice layer 67.

In this case, the production of mis-fit dislocations or the like is suppressed, even if there is a difference of the lattice constants between InP and GaP. As a result, the p-type InP layer 26 formed on the superlattice layer has a high quality and there is less crystal defects.

In the embodiment shown in FIG. 7A, the $Ga_xIn_{1-x}P$ layer 27 has a large bandgap and accordingly there is formed a potential barrier against the minority carriers generated in the InP layer 26, so that conversion efficiency is enhanced.

Figure 7C:
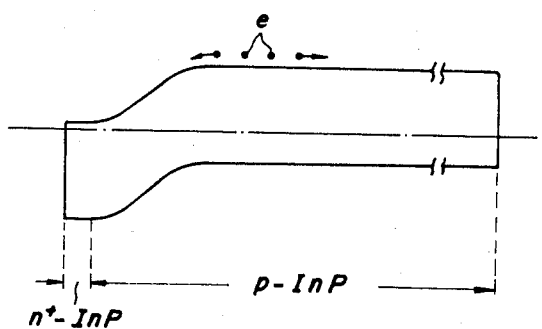

The potential barrier effect will be further explained by referring to FIGS. 7B and 7C, corresponding to the embodiment shown in FIG. 7A and the prior art n$^+$-p junction type InP solar cell, respectively. In FIGS. 7B and 7C, e indicates an electron or a flow of electrons.

As seen from FIG. 7B, the minority carrier (electron e) generated in the p-type InP layer cannot diffuse backward because of the potential barrier formed by the p-$Ga_xIn_{1-x}P$ layer. As a result, the number of electrons flowing into the n$^+$-type InP layer is increased and accordingly the conversion efficiency is improved.

In FIG. 7C, the electrons e generated in the p-type InP layer further diffuse inward of the p-type InP layer, so that the number of electrons flowing into the n+-type InP layer is less than in the case of FIG. 7B. This means a decrease of conversion efficiency.

InP has a lower surface recombination velocity than GaAs, so that an InP solar cell structure does not require a window layer which is essential in a GaAs solar cell. Consequently, an InP solar cell can be fabricated with a simple device structure, as shown in FIGS. 5, 6, 7A, 7D or 7E.

FIG. 8 shows a fourth embodiment of an InP solar cell according to the present invention. Here, reference numeral 31 denotes an n-type InP single crystal substrate and 32 a p-type InP layer grown on the substrate 31. The ohmic contacts 3 having a grid pattern are disposed on the p-type InP layer 32. The anti-reflection coating 4 is placed to cover the contacts 3 on the p-type InP layer 32. The rear surface electrode 5 is disposed on the rear surface of the substrate 31.

FIG. 9 shows a fifth embodiment of an InP solar cell according to the present invention. Here, an n-type InP epitaxial layer 46 is epitaxially grown on an n-type InP single crystal substrate 41 having a high carrier concentration. The p-type InP layer 32 is arranged on the epitaxial layer 46. The ohmic contacts 3 having a grid pattern, the anti-reflection coating 4 and the rear surface electrode 5 have the same arrangement as in the embodiment shown in FIG. 8.

Figure 10:
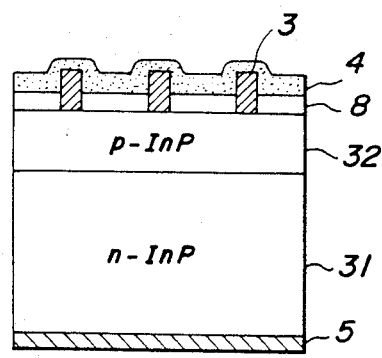

FIG. 10 shows a sixth embodiment of an InP solar cell according to the present invention. Here, a p-type window layer 8, for example, of $(Al_xGa_{1-x})_{0.47}In_{0.53}As$ or $Al_{0.47}In_{0.53}As$, which is lattice-matched to InP, is fabricated on the p-type InP layer 32 in the solar cell structure in FIG. 8. The anti-reflection coating 4 is fabricated on the p-type window layer 8. The remaining configuration is the same as in FIG. 8.

Figure 11:
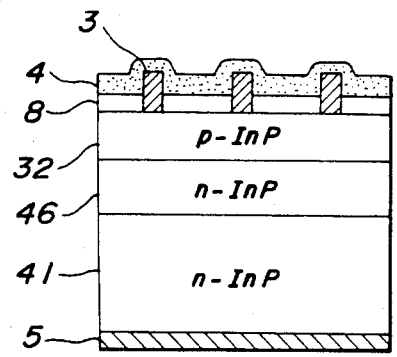

FIG. 11 shows a seventh embodiment of an InP solar cell according to the present invention. Here, a p-type window layer 8, for example, of $(Al_xGa_{1-x})_{0.47}In_{0.53}As$ or $Al_{0.47}In_{0.53}As$, is fabricated on the p-type InP layer 32 in the solar cell structure shown in FIG. 9. The anti-reflection coating 4 is fabricated on the p-type window layer 8. The remaining configuration is the same as the structure in FIG. 9.

Substrate layers 1 and 31 in FIGS. 5, 8, and 10 function both as an active layer for photovoltaic operation and a substrate layer. In the embodiments shown in FIGS. 6, 7A, 7D, 7E, 9, and 11, the active layer and the substrate layer are formed separately, i.e., as the layers 16 and 11; 26 and 21; and 46 and 41. While these separate layers provide a rather complicated structure, this layer structure is advantageous with regard to problems of increased series resistance resulting from reduced carrier concentration due to the irradiation.

In addition, the multi-layer structure can employ a silicon substrate, as shown in FIGS. 7A, 7D, or 7E, which is light and inexpensive, so that an InP solar cell with light weight and low cost can be realized.

Attention should be paid to the structure of the InP solar cell shown in FIG. 5, where a window layer made from a material of a large bandgap, as in conventional GaAs solar cells, is not required and a simple structure (e.g., in the embodiment in FIGS. 5 to 9) offers advantages for fabrication. This advantage of the InP solar cell is attributable to a lower surface recombination velocity for InP by about three orders of magnitude than that for GaAs.

Figure 12:
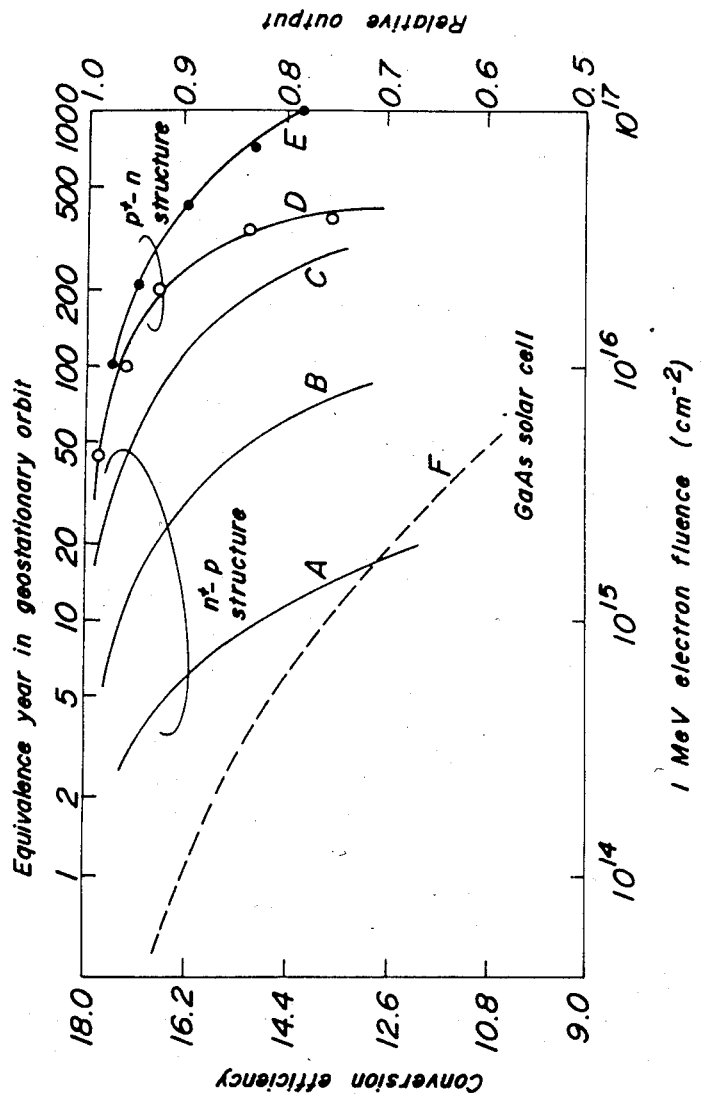
FIG. 12 is a graph of characteristics curves for the comparison of changes in conversion efficiency caused by 1 MeV electron irradiation on a conventional GaAs solar cell and on a solar cell in accordance with the present invention.

FIG. 12 contrasts a conventional heteroface GaAs solar cell (curve F) with an InP solar cell in accordance with the present invention with respect to changes in efficiency due to 1 MeV electron irradiation when junction depth $x_j$ is 0.7 μm. Curves A, B and C correspond to cases where the p-type InP substrate 1 in FIG. 5 has a carrier concentration $p_0 \approx 5 \times 10^{15}$ cm$^{-3}$, $p_0 \approx 2 \times 10^{16}$ cm$^{-3}$ and $p_0 \approx 1 \times 10^{17}$ cm$^{-3}$, respectively. Curves D and E show cases where the n-type InP substrate 31 in FIG. 8 has a carrier concentration $n_0 \approx 5 \times 10^{15}$ cm$^{-3}$ and $n_0 \approx 1 \times 10^{16}$ cm$^{-3}$, respectively.

As shown in FIG. 12, the characteristics of an InP solar cell according to the present invention are superior to those of the heteroface GaAs solar cell, which hitherto has been considered to have good radiation resistance. If it is assumed that the lifetime of a solar cell is defined as the period during which the efficiency of the solar cell is maintained at 75% or more relative to its initial efficiency, FIG. 12 clearly shows that when an InP solar cell is used in a space environment, an InP solar cell with an n+-p structure can be expected to have a lifetime of at least 10 years and an InP solar cell with a p+-n structure can be expected to have a lifetime of at least 200 years.

InP solar cells according to the present invention show that radiation degradation decreases as the p-layer or n-layer carrier concentration increases and that radiation degradation in the p+-n structure is less than in the n+-p structure.

Figure 13:
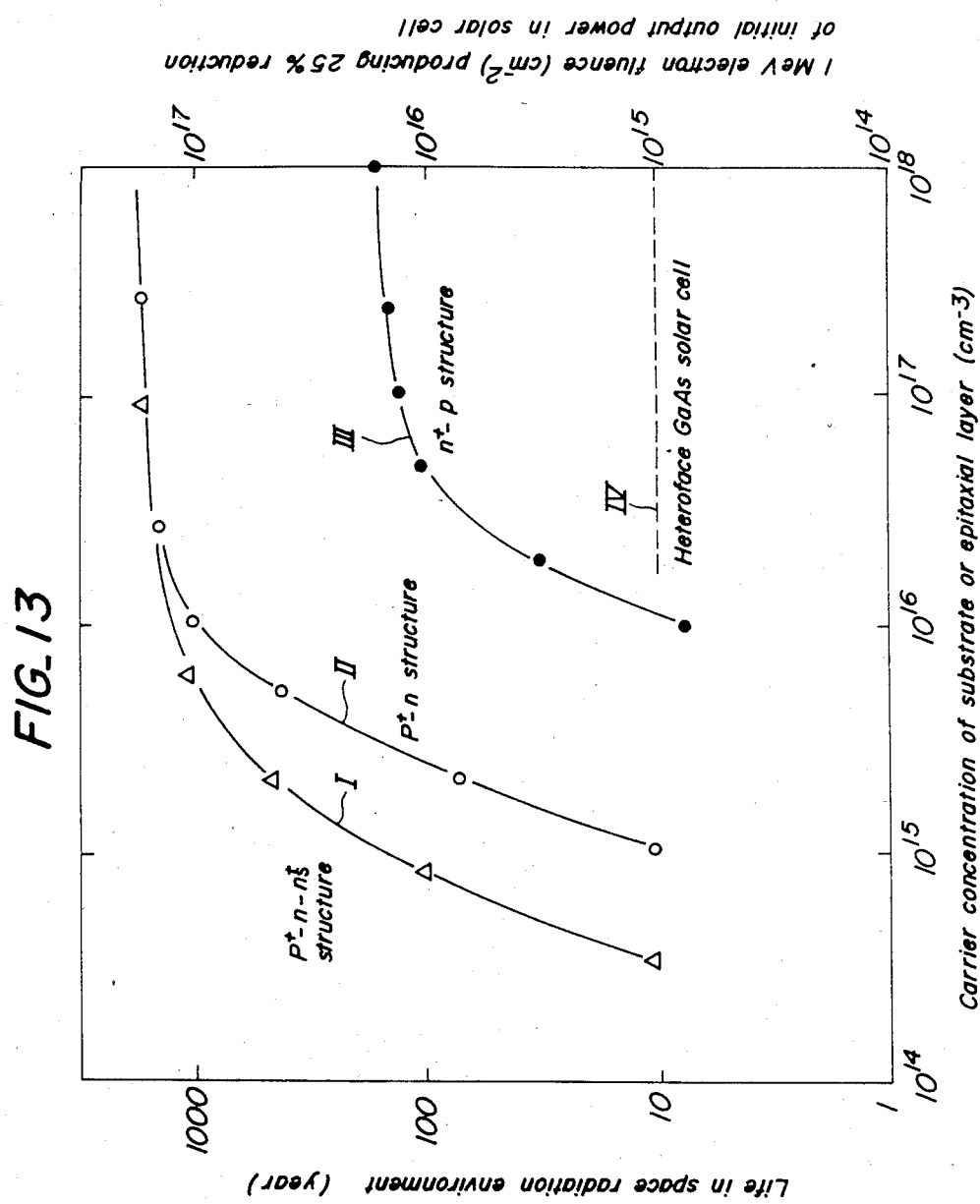
FIG. 13 is a graph illustrating the effect of carrier concentration of the substrate or epitaxial layer on radiation resistance of a solar cell in accordance with the present invention.

In a solar cell of the present invention as shown in FIGS. 5-11, a relation as shown in FIG. 13 exists between carrier concentration $n_0$ or $p_0$(cm$^{-3}$) of the InP single crystal substrate, or the InP epitaxial layer, and 1 MeV electron fluence producing 25% reduction of initial output power, i.e., solar cell radiation resistance. The relationship can be obtained by plotting electron fluence for various carrier concentrations, on a graph such as in FIG. 12, which shows the relationship between 1 MeV electron fluence and relative output or conversion efficiency.

In FIG. 13, curve I is for a p+-n junction type InP solar cell according to the present invention shown in FIG. 9 or 11. Curve II is for a p+-n junction type InP solar cell according to the present invention shown in FIG. 8 or 10. Curve III, is for an n+-p junction type InP solar cell according to the present invention as shown in FIGS. 5, 6, 7A, 7D, or 7E. Curve IV is for a conventional GaAs solar cell.

In FIG. 13, the horizontal axis indicates either carrier concentration $p_0$ of a p-type InP substrate (FIG. 5) or a p-type expitaxial layer (FIGS. 6, 7A, 7D or 7E), or carrier concentration $n_0$ of an n-type InP substrate (FIG. 8 or 10) or an n-type epitaxial layer (FIG. 9 or 11) in a solar cell in accordance with this invention.

Curve IV in FIG. 13 is flat, because, in the case of the GaAs solar cell, the degree of decrease in minority carrier diffusion length due to 1 MeV electron irradiation is almost independent of carrier concentration of the n-type layer. On the other hand, in InP solar cells, both minority carrier diffusion length (FIG. 3) and carrier concentration decrease rate (FIG. 4) are heavily dependent on carrier concentration, and accordingly a 1 MeV electron fluence corresponding to 25% reduction of initial output shows a remarkable carrier concentration dependence.

It has been confirmed that radiation resistance characteristics of the n+-p junction type InP solar cells as shown in FIGS. 5, 6, 7A, 7D, or 7E are improved as the carrier concentration of the p-type InP substrate or the p-type InP epitaxial layer increases. Referring to FIG. 13, the carrier concentration of the p-type InP substrate or the p-type InP epitaxial layer can be determined as follows.

If a value of $2 \times 10^{16}$ cm$^{-3}$ or higher is selected as $p_0$ in curve III, the lifetime of the solar cells can be improved compared with the GaAs solar cells (curve IV). For that reason, if the carrier concentration is $2 \times 10^{18}$ cm$^{-3}$ or above, the diffusion length of the minority carrier (electron) will decrease and, in turn, initial conversion efficiency will decrease.

FIG. 13 clearly shows that in the embodiment shown in FIG. 8 or 10 (curve II), for p$^+$-n junction type InP solar cells according to the present invention, if a value of $1 \times 10^{15}$ cm$^{-3}$ or above is selected for carrier concentration $n_0$ of the n-type InP single crystal substrate, the characteristics obtained with the p$^+$-n junction type InP solar cells will surpass those of conventional GaAs solar cells (curve IV). If a value of $5 \times 10^{15}$ cm$^{-3}$ or more is selected for carrier concentration $n_0$ of the n-type InP single crystal substrate, the characteristics obtained with the p$^+$-n junction type InP solar cells will surpass those of the n$^+$-p junction type InP solar cells (curve III) as well. Note that the diffusion length of minority carriers (holes) decreases at $1 \times 10^{18}$ cm$^{-3}$ or higher, and that there is a consequent decrease in initial conversion efficiency.

Furthermore, in the structure shown in FIG. 9 or 11, it is seen that highly superior radiation resistance is obtained if the carrier concentration $n_0$ of the n-type InP layer 46 is determined to be $5 \times 10^{14}$ cm$^{-3}$ or more. It is to be noted that the structure shown in FIG. 9 or 11 shows a higher radiation resistance for the low carrier concentrations than that shown in FIG. 8 or 10. The reason for this is that the thickness of the n-type InP layer 46 is about 5 $\mu$m and is then relative to the 500 $\mu$m thickness of the substrate 31, and accordingly almost no problems occur even if the series resistance increases due to the decrease of carrier concentration caused by the irradiation.

When a p$^+$-n junction type InP solar cell according to the present invention has a structure as shown in FIG. 8 or 10, it is confirmed that radiation resistance characteristics are improved as carrier concentration of the n-type InP single crystal substrate 31 increases. When a p$^+$-n junction type InP solar cell according to the present invention has a structure as shown in FIG. 9 or 11, it is confirmed that radiation resistance characteristics are improved as carrier concentration in the n-type InP layer 46 increases.

The carrier concentration of the n-type substrate 31 can be adjusted to an appropriate value by adding impurities such as Si, Sn, Ge, S, Se or Te. The characteristics shown in FIG. 12 is not changed according to the specific of impurities added.

In the configurations shown in FIGS. 8 through 11, the substrate 31 can be a (100) oriented n-type InP single crystal containing impurities such as Si, Sn, Ge, S, Se or Te and having a carrier concentration within the range of $1 \times 10^{15}$ through $1 \times 10^{18}$ cm$^{-3}$. The n-type InP single crystal substrate 41 having a high carrier concentration can also be made of a (100) oriented n-type InP single crystal that contains the above stated impurities to such an extent that the carrier concentration is adjusted to be within the range of $5 \times 10^{17}$ through $1 \times 10^{19}$ cm$^{-3}$.

The n-type InP epitaxial layer 46 can be fabricated by metal organic chemical vapor deposition, conventional liquid phase epitaxy, vapor deposition using halogen compounds, or molecular beam epitaxy and given a carrier concentration within a range of $2 \times 10^{14}$ through $5 \times 10^{17}$ cm$^{-3}$ and a thickness of 1–5 $\mu$m.

The p-type InP layer 32 may be grown by epitaxy on the n-type InP single crystal substrate 31 or the n-type epitaxial layer 46. Alternatively, the surface portion of the n-type InP single crystal substrate 31 or the n-type InP epitaxial layer 46 may be converted to p-type by thermally diffusing acceptor impurities such as Zn. Here, the carrier concentration of the p-type InP layer 32 can be within the range of $5 \times 10^{17}$ through $1 \times 10^{19}$ cm$^{-3}$ and the junction depth $x_j$ can be within the range of 0.05 through 2 $\mu$m.

Figure 14:
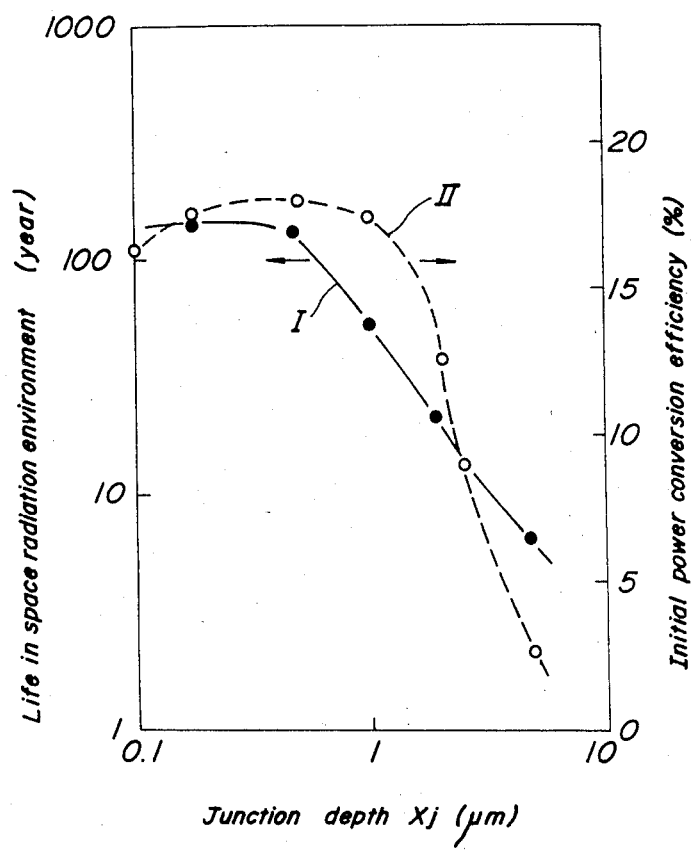
FIG. 14 is a graph illustrating the effect of junction depth on radiation resistance and on an initial conversion efficiency of a solar cell in accordance with the present invention.

For the structure of an InP solar cell ($n_0 = 1 \times 10^{16}$ cm$^{-3}$) shown in FIG. 8 or 10, curve I in FIG. 14 shows the relation between radiation resistance, i.e., lifetime in a space radiation environment (1 MeV electron fluence corresponding to 25% reduction of initial output) and thickness of the p-type InP layer 32, i.e., junction depth $x_j$. It can be understood that the radiation resistance characteristic is improved as the junction depth $x_j$ is reduced.

In addition, from the relationship between initial conversion efficiency and junction depth $x_j$, shown by curve II, it can be seen that conversion efficiency prior to the irradiation (initial conversion efficiency value) of the InP solar cell also increases as junction depth $x_j$ is reduced.

From the results shown in FIG. 14, an InP solar cell with superior radiation resistance characteristics and high efficiency will be realized, if the junction depth $x_j$, i.e., the thickness of p-type InP layer 32 is 2 $\mu$m or less.

If $x_j$ is 0.1 $\mu$m or less, the resistance in the horizontal direction, which is parallel to the junction surface, of the p$^+$-layer 32 will increase, and as a result, the initial conversion efficiency drops. The reason why $x_j$ is determined to be larger in the p$^+$-layer 32 than in the case of the n$^+$-layer 2 in FIG. 5 or 6, to be described later, is that Zn or Cd as a dopant can be doped in the p$^+$-layer 32 to obtain a carrier concentration of only about $10^{18}$ cm$^{-3}$, while S, Se or Te as a dopant can be doped in the n$^+$-layer 2 to obtain a carrier concentration as high as $10^{20}$ cm$^{-3}$, and that hole mobility is lower than electron mobility.

In the n$^+$-p and n$^+$-p-p$^+$ structures shown in FIGS. 5, 6, 7A, 7D and 7E, InP solar cell radiation resistance characteristics are also improved as the junction depth $x_j$ decreases. As a consequence, an InP solar cell having superior radiation resistance characteristics and high initial efficiency can be obtained by determining $x_j$ to be 1 $\mu$m or less. If in this case $x_j$ is at or less than 0.05 $\mu$m, initial conversion efficiency is reduced, since the resistance in the horizontal direction, which is parallel to the junction surface, of the n$^+$ layer 2 increases, so that there is a resulting increase in the series resistance component. Reproducibility of fabricating the solar cell is also markedly reduced, if $x_j$ is at or less than 0.05 $\mu$m.

Next, fabrication of the ohmic contacts 3 shown in FIGS. 8, 9, 10 or 11 will be explained. In the case of the p$^+$-n junction type InP solar cell shown in FIGS. 8, 9, 10 or 11, Au-Zn (5%) is deposited on the p-type InP layer 2 to a thickness of about 2000 Å by vacuum deposition. Then, the grid pattern having, for example, an interval of 500 $\mu$m and a width of 50 $\mu$m is fabricated by a lift-off method using photoresist. Ta$_2$O$_5$ can be used for the anti-reflection coating 4 shown in FIGS. 8, 9, 10 or 11, and the Ta$_2$O$_5$ film is deposited on the layer 32 or 8 to a thickness of 700 Å by vacuum deposition, in a manner such that the film covers the grid electrode 3.

For the rear surface electrode 5 of the p+-n junction type InP solar cell shown in FIGS. 8, 9, 10 or 11, Au-Sn (10%) can be deposited on the rear surface of the substrate 31 or 41 to a thickness of about 2000 Å by vacuum deposition.

In FIG. 10 or 11, the p-type window layer 8 can be formed with AlGaInAs or AlInAs, for example $(Al_x Ga_{1-x})_{0.47}In_{0.53}As$ or $Al_{0.47}In_{0.53}As$. In addition to lattice matching to InP, the p-type window layer 8 is required to have an energy gap larger than that of InP, and the thickness of the window layer 8 must be as thin as possible. When the p-type window layer 8 has, for example, a carrier concentration of $1 \times 10^{18}$ cm$^{-3}$ and is formed with an $Al_{0.47}In_{0.53}As$ film having a thickness of 0.2 μm, a conversion efficiency of 17.3% is obtained with the structure shown in FIG. 10 and a conversion efficiency of 17.8% with the structure shown in FIG. 11.

The window layer contributes to enhance efficiency, even though this contribution is not as great as it is to GaAs solar cells, as previously stated, due to a low surface recombination velocity.

In the case of the n+-p junction type InP solar cell as shown in FIG. 5 or 6, the grid contacts 3 and the rear surface electrode 5 can be formed by depositing Au-Sn (10%) and Au-Zn (5%) on the n-InP layer 2 and on the substrate 1 or 11, respectively, by vacuum deposition, contrary to the deposition in the case of the p+-n junction type solar cells described above.

Further, it is to be noted that the grid electrode 3, the anti-reflection coating 4, the rear surface electrode 5, and the window layer 8 are all well-known to those skilled in the art and can be fabricated with conventional materials and methods. Therefore, the above examples of the portions 3, 4, 5 and 8 are merely for illustration purposes only.

Next, explanation will be made of differences in solar cell characteristics based on differences in the configurations of the embodiments of a solar cell according to the present invention as shown in FIGS. 5 through 9.

In the embodiment shown in FIG. 6, both the high carrier concentration p-type InP single crystal layer 11 functioning only as a substrate, and the p-type InP layer 16 functioning as a p-type semiconductor to form the n+-p junction are used in place of the p-type InP single crystal substrate 1 in FIG. 5. In the case of the n+-p junction type solar cell, the lower the p-type semiconductor carrier concentration $p_0$, the larger the width of the junction depletion layer, so that there is the possibility that the conversion efficiency is increased. However, if the carrier concentration $p_0$ of the p-type InP single crystal substrate 1 in the structure shown in FIG. 5 is reduced in order to improve efficiency, resistivity in the substrate 1 will increase. Accordingly, the increased series resistance will induce reductions in fill factors. As a result, efficiency will not be improved.

On the other hand, the structure of FIG. 6 has the advantage of producing almost no problem in increased series resistance, since even if the carrier concentration of the p-type InP layer 16 in the n+-p junction is low, the p-type InP layer 16 has a thickness as thin as 1-5 μm.

The same discussion is also applicable to the p+-n junction type solar cells. For example, the structure shown in FIG. 9 is more advantageous than the structure shown in FIG. 8, since the former has both the high carrier concentration n-type InP single crystal substrate 41 functioning only as a substrate and the n-type InP layer 46 functioning to form the p+-n junction.

Another important advantage derived from the separation of functions of substrate and the formation of p-n junction is that it is not necessary to form the substrate with InP. In other words, the substrate can be formed with Si which is light and inexpensive instead of InP which is heavy and expensive, so that a light and inexpensive InP solar cell can be fabricated by using such a Si substrate. One embodiment of this type of InP solar cell is shown in FIG. 7A. While the structure shown in FIG. 7A is for an n+-p junction structure, the Si substrate can also advantageously be used in case of a p+-n junction structure.

When the p-type window layer 8 is provided as shown in FIG. 10 or 11, the efficiency can be improved. In this case, however, the surface recombination velocity of InP is low, as mentioned above, so that the window layer does not contribute to enhance the efficiency of an InP solar cell as remarkably as the window layer in GaAs solar cells.

The following is a discussion of specific examples of the present invention. The present invention is not limited to these examples.

EXAMPLE 1 (n+-p structure; shown in FIG. 5)

An InP solar cell having an n+-p structure as shown in FIG. 5 was fabricated as in the following steps.

A 7 mm×7 mm, 350 μm thick, (100) oriented p-type InP substrate was polished to a mirror surface by mechanical polishing. The p-type InP substrate was doped with Zn and had a carrier concentration of $5 \times 10^{16}$ cm$^{-3}$. After the p-type InP substrate was degreased by ultrasonic cleaning in trichloroethylene, it was chemically polished with a 1% Br-methanol solution.

Five pieces of p-type InP substrates were vacuum-sealed along with 5 mg red phosphorus and 50 mg indium sulfide ($In_2S_3$) into a 10 mmφ inner diameter quartz ampoule at a pressure of $1 \times 10^{-6}$ Torr. The quartz ampoule was subjected to heat treatment in an electric furnace at 650° C. for three hours.

Sulfur was thermally diffused into the p-type InP substrate by this thermal treatment for an n+-type InP layer of 0.5 μm thickness and $5 \times 10^{18}$ cm$^{-3}$ carrier concentration on the surface of the InP substrate. An n+-type InP layer was also grown on the rear surface of the p-type InP substrate. In order to remove this rear side n+-type InP layer, the rear surface was etched off to a depth of 5-10 μm with 1% Br-methanol solution, while protecting the front surface with Apiezon wax after the p-type InP substrate was taken out from the quartz ampoule.

A Au-Zn (7 wt %) film was then formed by vacuum deposition, to a thickness of 2000 Å, on the rear surface of the p-type InP substrate. This substrate was subjected to heat treatment in a flowing 500 ml/min nitrogen gas atmosphere at 450° C. for five minutes, so that ohmic contact electrodes were formed on the p-type InP substrate. Ohmic contact electrodes were applied to the surface of the n+-type InP layer as follows. An AZ-1350J photoresist was used to form a grid pattern having a width of 50 μm and an interval of 500 μm on the n+-type InP layer. An Au-Sn (10 wt %) film having a thickness of 2000 Å was formed on the n+-type layer by vacuum deposition, and then the grid electrodes were formed by a lift-off method. In this state, ohmic contacts were formed between the Au-Sn film and the n+-type InP surface, and thus thermal treatment was not required.

The p-type InP substrates were cleaved, so that device dimensions were 5 mm×5 mm. Then, while the Au-Zn electrodes were positioned on the bottom side, the device was mounted with silver paste on a silver coated alumina plate. For a lead wire, an Al wire was connected to the Au-Sn electrodes using an ultrasonic bonder.

A device functioning as a solar cell was manufactured by the processes up to this step. In order to reduce reflection loss of light on the front surface, an antireflection coating was grown on the surface of the n+-type InP layer. The device mounted to the alumina plate was placed in a vacuum evaporation system without further modification and at a vacuum of about $1 \times 10^{-6}$ Torr, a $Ta_2O_5$ film of 800 Å thickness was formed on the entire surface of the specimen by electron beam deposition.

When the photoelectric conversion efficiency of the thus fabricated solar cell was measured by using an air mass (AM) 1.5 solar simulator as a light source, an efficiency of 16.8% was obtained at an open-circuit voltage $V_{oc}$ of 0.81 V, a short-circuit current density of 28 mA/cm$^2$, and fill factor of 0.74. The fabricated solar cell was irradiated with 1 MeV electrons to evaluate its radiation resistance. The irradiation was performed at room temperature and under open-circuit condition. As a comparison, a heteroface GaAs solar cell (conversion efficiency 18%) having a junction depth of 0.5 μm was also irradiated at the same time. After 1 MeV electron irradiation of $1 \times 10^{15}$ cm$^{-2}$ fluence, conversion efficiency for the InP solar cell according to the present invention was 15.8%, whereas conversion efficiency for the heteroface GaAs solar cell was 13.3%. Thus, after 1 MeV electron irradiation of $1 \times 10^{15}$ cm$^{-2}$ fluence in this way, conversion efficiency was reduced approximately to 75% of the initial value in the conventional GaAs solar cell, while conversion efficiency was maintained at approximately 95% of the initial value in the InP solar cell in accordance with this invention.

EXAMPLE 2 (n+-p-p+ structure; shown in FIG. 6)

An InP solar cell having an n+-p-p+ structure as shown in FIG. 6 was fabricated by liquid phase epitaxy. A (100) oriented InP crystal with carrier concentration of $2 \times 10^{18}$ cm$^{-3}$ (Zn doped) was prepared as the p+-type substrate. Surface finishing of the p+-type substrate was the same as with the p-type substrate in EXAMPLE 1.

Using the step-cleaning method with In as solvent, a Zn doped p-type InP layer with $7 \times 10^{16}$ cm$^{-3}$ carrier concentration and 4 μm thickness and a Te doped n+-type InP layer with $7.5 \times 10^{18}$ cm$^{-3}$ carrier concentration and 0.3 μm thickness were sequentially grown on the p+-type substrate. Here, the growth temperature was 590° C. and the molar fraction of Zn and Te in In melt were $4 \times 10^{-6}$ and $9.8 \times 10^{-4}$, respectively.

Subsequent fabrication processes, i.e., the processes from the formation of ohmic contact electrode to the formation of the $Ta_2O_5$ anti-reflection coating on the p+-type substrate and the n+-type layer were the same as with EXAMPLE 1.

When the photoelectric conversion efficiency of the thus fabricated solar cell was measured by using an air mass 0 solar simulator as a light source, an efficiency of 16.5% was obtained. The fabricated solar cell was irradiated with a 1 MeV electron to evaluate its radiation resistance. A 16.0% conversion efficiency was obtained, even after irradiation with 1 MeV electrons of $1 \times 10^{15}$ cm$^{-2}$ fluence. Thus, it was confirmed that the device had superior radiation resistance.

EXAMPLE 3 (n+-p-p+ structure on Si substrate; shown in FIG. 7A)

The metal organic chemical vapor deposition (MOCVD) method was used to fabricate an InP solar cell with an n+-p-p+ structure on an Si substrate.

A (100) oriented and B-doped p-type Si crystal with $1 \times 10^{-2}$ Ω·cm resistivity was used for the Si substrate. The surface of the Si substrate was processed using chemical polishing with CP4 etchant. To prevent the formation of a native oxide film, the Si substrate was stored in a hydrofluoric acid solution until immediately before the insertion of the Si substrate into the MOCVD system reactor.

Using the MOCVD system with the horizontal reactor, a p-type GaP layer, p-type $Ga_xIn_{1-x}P$ layer, p-type Inp layer and n+-type InP layer were successively grown on the Si substrate at a pressure of 0.1 atmosphere. With triethyl-gallium (TEG) and phosphine (PH$_3$) as raw materials and diethyl-zinc (DEZ) as a doping gas, the p-type GaP layer having a thickness of 0.5 μm and $1 \times 10^{18}$ cm$^{-3}$ carrier concentration was grown at 700° C. growth temperature. Then, simultaneously with the reduction in TEG flow rate, triethyl-indium (TEI) was added to form the p-type $Ga_xIn_{1-x}P$ layer with x changing stepwise by 0.1 per step from 1 to 0, and having a carrier concentration of $1 \times 10^{18}$ cm$^{-3}$ (thickness of each step was 0.2 μm; and thickness of the entire layer was 2 μm). Growth temperature at this time was changed from 700° C. to 600° C., with reductions made at each step. Next, with TEI and PH$_3$ as raw material gases and DEZ as a doping gas, a p-type InP layer with a $1 \times 10^{16}$ cm$^{-3}$ carrier concentration and 3 μm thickness was formed. The doping gas was then changed from DEZ to hydrogen sulfide (H$_2$S) to form the n+-type InP layer having a $2 \times 10^{18}$ cm$^{-3}$ carrier concentration and 0.3 μm thickness.

An Al film of 2000 Å thickness was formed on the rear surface of the Si substrate by vacuum deposition. This Si substrate was subjected to heat treatment in flowing nitrogen gas at 450° C. for 10 minutes, so that ohmic contact electrodes were formed on the Si substrate. An Au-Sn grid ohmic contact pattern on the n+-type InP layer was fabricated by the same steps as in EXAMPLE 1. The removal of the peripheral region of the substrate by cleaving, the mounting of the device onto an alumina plate, and the formation of the $Ta_2O_5$ anti-reflection coating were also performed in the same way as in EXAMPLE 1.

Conversion efficiency of the solar cells fabricated in this manner under simulated AM0 illumination was 16.5% initially and a conversion efficiency of 16.0% was obtained after 1 MeV electron irradiation of $1 \times 10^{15}$ cm$^{-3}$ fluence.

EXAMPLE 4 (n+-p-p+ structure on Si substrate; shown in FIG. 7D)

The native oxide film was removed from the surface of a (100) oriented p-type Si single crystal substrate having a resistivity of $10^{-2}$ Ωcm. Using triethyl-gallium and phosphine as raw materials, diethyl-zinc as a doping gas, a p-GaP layer having a carrier concentration of $1 \times 10^{18}$ cm$^{-3}$ and a thickness of 0.5 μm was formed on the Si substrate. Triethyl-indium was added to the raw materials, controlling flowing rates of each gas, so that a p-$Ga_xIn_{1-x}P$ layer having the composition factor x gradually changed from 1 to 0 and having a thickness of 3 μm was formed on the p-GaP layer.

Then, the supply of triethyl-gallium was interrupted, so that a p-InP layer having a carrier concentration of $1 \times 10^{16}$ cm$^{-3}$ and a thickness of 3 μm was formed on the $Ga_xIn_{1-x}P$ layer. Subsequently, hydrogen sulfide was supplied in place of diethyl-zinc as a doping gas to form an n-InP layer having a carrier concentration of $2 \times 10^{18}$ cm$^{-3}$ and a thickness of 0.3 μm. An ohmic contact electrode of Au-Ge having a grid pattern and an ohmic contact electrode of Al were formed by vacuum deposition. Then, an anti-reflection coating of $Si_3N_4$ having a thickness of 500 Å was formed by plasma CVD process on the n-InP layer and the patterned electrode.

This InP solar cell had a conversion efficiency of 16.5% under simulated AM0 illumination. This value of 16.5% is higher than the efficiency in the case of the solar cell having the InP single crystal substrate.

EXAMPLE 5 (n+-p-p+ structure on Si substrate; shown in FIG. 7E)

After the p-GaP layer was formed in the same manner as in EXAMPLE 4, the InP/GaP superlattice layer was formed. That is, while phosphine was continuously supplied, triethyl-indium (TEI) and triethyl-gallium (TEG) were supplied alternatively, each for 10 seconds, so that 50 InP layers each having a thickness of 100 Å and 50 GaP layers each having a thickness of 150 Å were laminated alternately. The total thickness of the superlattice layer was 1.25 μm. Further, Zn was doped in the superlattice layer in a manner such that its carrier concentration was $1 \times 10^{18}$ cm$^{-3}$.

The thus fabricated InP solar cell had a high conversion efficiency of 16.5% or more under simulated AM0 illumination.

EXAMPLE 6 (p$^{30}$-n structure; shown in FIG. 8)

An InP solar cell with a p+-n structure was fabricated by Zn diffusion method.

A (100) oriented and undoped InP crystal with $5 \times 10^{15}$ cm$^{-3}$ carrier concentration was prepared as the n-type InP substrate. Surface processing of the n-type InP substrate was the same as that of the p-type substrate in EXAMPLE 1.

Five n-type InP substrates, along with 5 mg of red phosphorus and 10 mg of zinc phosphide, were vacuum-sealed into a 100 mmφ inner diameter quartz ampoule evacuated to a pressure of $1 \times 10^{-6}$ Torr. The quartz ampoule was inserted into an electric furnace at 550° C. and was subjected to heat treatment for 30 minutes. By this heat treatment, the zinc (Zn) was diffused into the n-type InP substrate and formed a p+-type InP layer of 1.0 μm thickness and $2 \times 10^{18}$ cm$^{-3}$ carrier concentration on the surface of the n-type InP substrate. Since the diffusion coefficient of Zn in InP is normally large, the diffusion depth will be approximately 3 μm under the above conditions. But, with the present invention, excess phosphorus (P) was placed in the ampoule, so that phosphorus pressure in the ampoule was increased to suppress the diffusion of Zn and, as a result, a thin p+-type InP layer of 1.0 μm thickness was formed. A p+-type InP layer was also formed on the rear surface of the n-type InP substrate. In order to remove this rear side p+-type InP layer, the rear surface was etched off to a depth of 5–10 μm in 1% Br-methanol solution, while the front surface was protected with Apiezon wax.

Next, an Au-Sn (10 wt %) film of 2000 Å thickness was formed on the rear surface of the n-type InP substrate by vacuum deposition. The substrate was subjected to heat treatment in a flowing 500 ml/min nitrogen gas atmosphere at 400° C. for 5 minutes, so that ohmic contact electrodes were formed on the n-type InP substrate. Ohmic contact electrodes were applied to the surface of the p+-type InP layer in the following manner. Using an AZ-1350J photoresist, a grid pattern having a width of 50 μm and intervals of 500 μm was formed on the surface of the p+-type InP layer. An Au-Zn (7 wt %) film having a thickness of 2000 Å was formed on the resist by vacuum deposition, and then the grid Au-Zn contact electrodes were formed by a lift-off method. In this state, ohmic contacts were formed between the Au-Zn film and the p+-type InP surface, and thus thermal treatment was not required.

The solar cell was fabricated by the same process as used in EXAMPLE 1 and its conversion efficiency and radiation resistance were then evaluated. The results showed an initial efficiency at AM0 of 16.3% and a maintained output rate of 97.5%, after 1 MeV electron irradiation of $1 \times 10^{15}$ cm$^{-2}$ fluence.

EXAMPLE 7 (p+-n structure; shown in FIG. 8)

A 0.5 μm thick p-type InP layer containing $1 \times 10^{18}$ cm$^{-3}$ Zn as an impurity was formed on the surface of a (100) oriented n-type InP single crystal substrate containing $2 \times 10^{16}$ cm$^{-3}$ Si as an impurity. The metal organic chemical vapor deposition method was used because of its superior control of film thickness. The p-type layer was grown on the substrate, by using triethyl-indium $(C_2H_5)_3In$ and phosphine as raw materials, and diethyl-zinc $(C_2H_5)_2Zn$ as a dopant. Next, grid contact electrodes having approximately 2000 Å Au-Zn (5%) and 2000 Å thick Au-Sn (10%) rear surface electrode were formed by vacuum deposition. These were subjected to thermal treatment in a hydrogen gas atmosphere at 450° C. for five minutes, so that they exhibited ohmic contact. The grid contact electrodes had a 50 μm width and a 500 μm interval. The electrode patterns were formed by lift-off processing using photoresist. Finally, a 700 Å thick $Ta_2O_5$ anti-reflection coating was grown by vacuum deposition and then the solar cell having the structure as shown in FIG. 8 was fabricated.

When the InP solar cell having a light incident area of 1 cm$^2$, which was manufactured as described above, was measured under simulated AM0 (air mass zero) illumination, a 17% conversion efficiency was obtained. The 1 MeV electron irradiation fluence equivalent to a 25% reduction of initial output power was $1 \times 10^{17}$ cm$^{-2}$, corresponding to a lifetime of approximately 1,000 years, when converted to years of cell life.

EXAMPLE 8 (p+-n-n+ structure; shown in FIG. 9)

First, a S (sulfur)-doped n-type InP layer of $5 \times 10^{15}$ cm$^{-3}$ carrier concentration and 5 μm thickness, and then a Zn-doped p-type InP layer of $2 \times 10^{18}$ cm$^{-3}$ carrier concentration and 0.4 μm thickness, were epitaxially grown on the surface of the Sn-doped n-type InP single crystal substrate having a $2 \times 10^{18}$ cm$^{-3}$ carrier concentration. The epitaxial growth method used in this example was the metal organic chemical vapor deposition method employed in EXAMPLE 7. It is to be noted that a molecular beam epitaxy method may be used as an epitaxial growth method, in addition to the conventional liquid phase epitaxy method or the vapor deposition method using halogen compounds. Further, the p-type InP layer can also be formed by thermal diffusion of acceptor impurities such as Zn. In the present example, the shape and the formation processes of the front and rear surface electrodes and the antireflection coating were the same as in EXAMPLE 7. The InP solar cell fabricated in this way as shown in FIG. 9, had a conversion efficiency of 17.5% under simulated AM0 illumination. The 1 MeV electron irradiation fluence equivalent to a 25% reduction of initial output power was $5 \times 10^{16}$ cm$^{-2}$, i.e., when converted to years of life in the space environment, this was equivalent approximately to 500 years.

Since InP has a lower surface recombination velocity than GaAs, the window layer, which is indispensable to improve efficiency in GaAs solar cells, may be omitted. Even if such window layer is not provided, the solar cell device having a simple structure as shown in FIG. 8 or 9 had a conversion efficiency not inferior to the efficiency (16–18%) of GaAs solar cells.

EXAMPLE 9 (p+-n-n+ solar structure; shown in FIG. 9)

An InP solar cell having a p+-n-n+ structure as shown in FIG. 9 was fabricated by metal organic chemical vapor deposition (MOCVD).

A (100) oriented and Sn-doped InP crystal, having a $3 \times 10^{18}$ cm$^{-3}$ carrier concentration, was prepared as the n+-type InP substrate. Surface processing of the n+-type InP substrate was the same as for the substrate in EXAMPLE 1.

MOCVD growth of the n-type layer and the p+-type layer on the surface of the n+-type substrate was as follows. Triethyl-indium (TEI) was used for the In source and phosphine (PH$_3$) was used for the phosphorus source. The conditions selected were: 580° C. growth temperature, P/In (molar ratio) approximately 130 and total H$_2$ flow of 3.6 l/min. The reactor was a horizontally elongated one and internal reactor pressure during growth was 0.1 atmosphere. The InP growth rate was 1.2 μm/h. The non-doped InP layer of 4 μm thickness was first grown on the n+-type substrate. The non-doped layer was used for the n-type layer, since the non-doped layer exhibited n-type conductivity and its carrier concentration was $5 \times 10^{15}$ cm$^{-3}$. Next, the p+-type layer of 0.8 μm thickness was grown on the n-type layer by using diethyl-zinc (DEZ) as a doping gas. The carrier concentration of the p+-type layer was $3 \times 10^{18}$ cm$^{-3}$.

Ohmic contact electrodes were grown on the n+-type substrate and on the p+-type layer by the same process used in EXAMPLE 6. After removing the periphery of the substrate by cleaving, the substrate was mounted to the alumina plate, the lead wires were attached to the electrodes, and the Ta$_2$O$_5$ anti-reflection film was formed to complete the solar cell.

Conversion efficiency of the thus fabricated InP solar cells were measured under simulated AM0 illumination. A value of 17.0% was obtained. The solar cells were then irradiate with 1 MeV electrons of $1 \times 10^{16}$ cm$^{-3}$ fluence. The drop in conversion efficiency from initial value was only 5%, and thus it was confirmed that these solar cells had an excellent radiation resistance.

EXAMPLE 10 (p+-n structure; shown in FIG. 10)

After the grid contact electrodes were formed on the p-type InP layer in the same way as described in EX-AMPLE 7, a p-type Al$_{0.47}$In$_{0.53}$As window layer, having a carrier concentration of $1 \times 10^{18}$ cm$^{-3}$ and 0.2 μm thickness, was grown on the p-type InP layer by vacuum deposition. Next, the anti-reflection coating was deposited on the window layer in the same way as in EXAMPLE 7. The InP solar cell of the present example exhibited a conversion efficiency of 17% under simulated AM0 illumination. The 1 MeV electron irradiation fluence equivalent to a 25% reduction of initial output power was $1 \times 10^{17}$ cm$^{-2}$. In terms of years, that gave the solar cell a lifetime in space of about 1,000 years.

EXAMPLE 11 (p+-n-n+ structure; shown in FIG. 11)

After the grid contact electrodes were formed on the p-type InP layer in the same way as described in EXAMPLE 8, the p-type Al$_{0.47}$In$_{0.53}$As window layer, which has a carrier concentration of $1 \times 10^{18}$ cm$^{-3}$ and 0.2 μm thickness, was grown on the p-type InP layer by vacuum deposition. Next, the anti-reflection coating was grown on the window layer in the same way as in EXAMPLE 8. The InP solar cell of the present example had a conversion efficiency of 17.5% under simulated AM0 illumination. The 1 MeV electron irradiation fluence equivalent to a 25% reduction of initial output power was $5 \times 10^{16}$ cm$^{-2}$. In terms of years, that gave the solar cell a lifetime in space of about 500 years.

As previously stated, by using InP solar cell material and optimizing carrier concentration and a junction depth of the p-type or n-type substrate and the p-type or n-type epitaxially grown layer, the present invention has such advantages as solar cell radiation resistance superior to conventional solar cells, and, moreover, a high photovoltaic conversion efficiency.

Consequently, a solar cell in accordance with the present invention, is advantageously applicable to a solar cell to be used in space. Further, it is to be noted that in "High-efficiency InP homojunction solar cells," by G. W. Turner et al. (*Appl. Phys. Lett.*, Vol. 37(4), 1980, pp. 400–402), the n+-layer was doped with Sn. In contrast, in the present invention, at least one element of S, Se or Te from the group VIA in the periodic table of elements, is doped in the n+-layer of the n+-p or n+-p-p$^{30}$ structure. These dopants have a markedly higher solid solubility in InP than group IVA elements such as Si, Ge or Sn. Sn, for example, can be doped to only about $2 \times 10^{18}$ cm$^{-3}$, while S, Se or Te can be doped to at least $10^{20}$ cm$^{-3}$. This means that the n+-type layer can be highly doped, even if the n+-type InP layer is thin, so that resistance in this n+-type layer is decreased. In other words, if S, Se or Te is used as a dopant, the n+-type InP layer can be much thinner than when Sn is used as a dopant. Thus, solar cell efficiency is increased and radiation resistance is improved.

Figure 15:
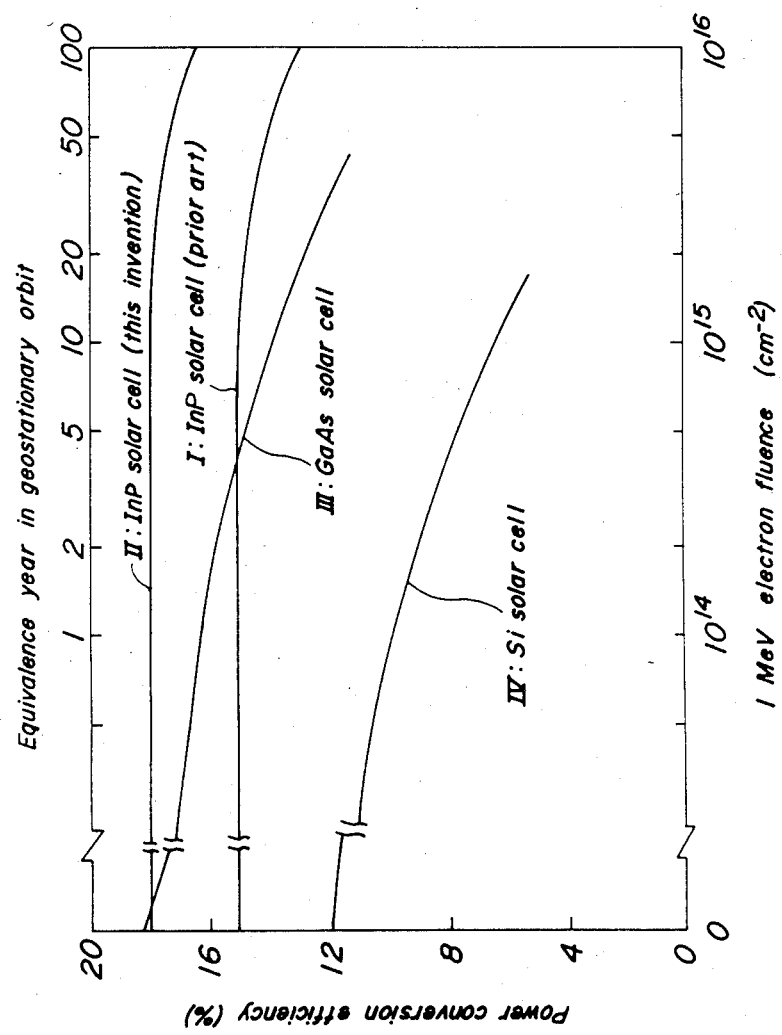
FIG. 15 is a graph of characteristic curves for the comparison of the manner of radiation degradation of conversion efficiencies for conventional solar cells and for a solar cell in accordance with the present invention.

FIG. 15 shows the comparison of radiation degradation on conversion efficiency of the above mentioned InP homojunction solar cell of the prior art (curve I) and the InP solar cell in accordance with the present invention (curve II) in addition to a prior art GaAs solar cell (curve III) and a Si solar cell (curve IV).

Due to high vapor pressures, these dopants (S, Se and Te) can also be doped by diffusion from the vapor phase. This vapor phase diffusion simplifies solar cell fabrication. Especially shallow and steep n+-p junctions can be fabricated by the sulphur diffusion.

In addition, when InP is grown with liquid phase epitaxy (LPE) using In as a solvent, S, Se or Te can be doped in high concentrations because of their large distribution coefficients. For example, the distribution coefficient for Te is 0.3, while that for Sn is $2 \times 10^3$. Thus, these dopants are preferable for high concentration doping in LPE.

What is claimed is:

1. An InP solar cell comprising:
   a p-type InP single crystal substrate having a carrier concentration of $2 \times 10^{16}$–$2 \times 10^{18}$ cm$^{-3}$;
   an n-type InP layer containing a dopant of at least one group VIA element selected from S and Se disposed on said substrate and with a thickness of 0.05–1 μm, said n-type InP layer having a carrier concentration of $5 \times 10^{17}$–$1 \times 10$ cm$^3$;
   a grid electrode arranged on said n-type InP layer; and
   an anti-reflection coating formed on said n-type InP layer and said grid electrode.

2. The InP solar cell as claimed in claim 1, wherein a rear surface electrode is arranged on the rear surface of said p-type substrate.

3. An InP solar cell comprising:
   a p-type semiconductor single crystal substrate;
   a p-type InP layer formed by epitaxial growth on said substrate and having a carrier concentration of $2 \times 10^{16}$–$2 \times 10^{18}$ cm$^{-3}$;
   an n-type InP layer containing a dopant of at least one group VIA element selected from S, Se, and Te disposed on said epitaxially grown p-type InP layer and with a thickness of 0.05–1 μm, said n-type InP layer having a carrier concentration of $5 \times 10^{17}$–$1 \times 10^{19}$ cm$^{-3}$;
   a grid electrode arranged on said n-type InP layer; and
   an anti-reflection coating formed on said n-type InP layer and said grid electrode.

4. The InP solar cell as claimed in claim 3, wherein said p-type semiconductor single crystal substrate is InP.

5. The InP solar cell as claimed in claim 3, wherein said p-type semiconductor single crystal substrate is Si.

6. The InP solar cell as claimed in claim 3, wherein a rear surface electrode is arranged on the rear surface of said p-type substrate.

7. An InP solar cell comprising:
   an n-type InP single crystal substrate having a carrier concentration of $1 \times 10^{15}$–$1 \times 10^{18}$ cm$^{-3}$;
   a p-type InP layer formed on said substrate and having a thickness of 0.1–2 μm;
   a grid electrode arranged on said p-type InP layer; and
   an anti-reflection coating formed on said p-type InP layer and said grid electrode.

8. The InP solar cell as claimed in claim 7, further comprising a window layer between said p-type InP layer and said anti-reflection coating.

9. The InP solar cell as claimed in claim 8, wherein said window layer is $(Al_xGa_{1-x})_{0.47}In_{0.53}As(0<x\leq 1)$ or $Al_{0.47}In_{0.53}As$.

10. The InP solar cell as claimed in claim 7, wherein a rear surface electrode is arranged on the rear surface of said n-type substrate.

11. An InP solar cell comprising:
    an n-type semiconductor single crystal substrate;
    an n-type InP layer formed by epitaxial growth on said substrate and having a carrier concentration of $5 \times 10^{14}$–$1 \times 10^{18}$ cm$^{-3}$;
    a p-type InP layer formed on said epitaxially grown n-type InP layer and having a thickness of 0.1–2 μm;
    a grid electrode arranged on said p-type InP layer; and
    an anti-reflection coating formed on said p-type InP layer and said grid electrode.

12. The InP solar cell as claimed in claim 11, further comprising a window layer between said p-type InP layer and said anti-reflection coating.

13. The InP solar cell as claimed in claim 12, wherein said window layer is $(Al_xGa_{1-x})_{0.47}In_{0.53}As(0<x\leq 1)$ or $Al_{0.47}In_{0.53}As$.

14. The InP solar cell as claimed in claim 12, wherein a rear surface electrode is arranged on the rear surface of said n-type substrate.

15. The InP solar cell as claimed in claim 11, wherein said n-type semiconductor single crystal substrate is InP.

16. The InP solar cell as claimed in claim 11, wherein said n-type semiconductor single crystal substrate is Si.

17. The InP solar cell as claimed in claim 11, wherein a rear surface electrode is arranged on the rear surface of said n-type substrate.

18. An InP solar cell comprising:
    a Si single crystal substrate;
    first and second InP layers forming a p-n junction which is parallel to the surface of said substrate;
    a $Ga_xIn_{1-x}P$ layer ($0 \leq x \leq 1$) arranged between said substrate and said first InP layer, said $Ga_xIn_{1-x}P$ layer having a GaP layer portion or a $Ga_xIn_{1-x}P$ layer portion having a high proportion of Ga on the side of said substrate and having an InP layer portion or a $Ga_xIn_{1-x}P$ layer portion having a high proportion of In on the side of said first InP layer;
    a grid electrode arranged on said second InP layer; and
    an anti-reflection coating formed on said second InP layer and said grid electrode.

19. The InP solar cell as claimed in claim 18, wherein the composition factor x of said $Ga_xIn_{1-x}P$ layer gradually decreases from the side of said substrate toward said first InP layer.

20. The InP solar cell as claimed in claim 18, wherein said $Ga_xIn_{1-x}P$ layer is an InP/GaP superlattice layer having InP layers and GaP layers which are laminated alternately and of which the layer adjacent to said substrate is one of said GaP layers and the layer adjacent to said first InP layer is one of said InP layers.

21. The InP solar cell as claimed in claim 18, wherein said Si single crystal substrate is a p-type Si single crystal substrate, said first InP layer is a p-type InP layer having a carrier concentration of $2 \times 10^{16}$–$2 \times 10^{18}$ cm$^{-3}$, and said second InP layer is an n-type InP layer containing a dopant of at least one group VIA element selected from S and Se and having a carrier concentration of $5 \times 10^{17}$–$1 \times 10^{19}$ cm$^{-3}$ and with a thickness of 0.05–1 μm.

22. The InP solar cell as claimed in claim 18, wherein said Si single crystal substrate is an n-type Si single crystal substrate, said first InP layer is an n-type InP layer having a carrier concentration of $5 \times 10^{14}$–$1 \times 10^{18}$ cm$^{-3}$, and said second InP layer is a p-type InP layer having a thickness of 0.1–2 μm.

* * * * *

UNITED STATES PATENT AND TRADEMARK OFFICE
CERTIFICATE OF CORRECTION

PATENT NO. : 4,591,654
DATED : May 27, 1986
INVENTOR(S) : M. Yamaguchi, et al.

It is certified that error appears in the above-identified patent and that said Letters Patent is hereby corrected as shown below:

Column 1, line 24, change "is decisive of" to --is decisive for--.

Column 2, line 49, change "has" to --have--.

Column 3, line 3, change "53As" to --$53_{As}$--.

Column 3, line 13, change "53As" to --$53_{As}$--.

Column 3, line 16, change "electrode is" to --electrode be--.

Column 3, line 46, change "accompanied" to --accompanying--.

Column 3, line 66, change "characteristics" to --characteristic--.

Column 4, line 29, change "including" to --inducing--.

Column 5, line 54, change "in case" to --in the case--.

UNITED STATES PATENT AND TRADEMARK OFFICE
CERTIFICATE OF CORRECTION

PATENT NO. : 4,591,654

DATED : May 27, 1986

INVENTOR(S) : M. Yamaguchi, et al.

It is certified that error appears in the above-identified patent and that said Letters Patent is hereby corrected as shown below:

Column 9, line 55, change "is not changed" to --are not changed--.

Column 12, line 44, change "treatment for an" to --treatment to form an--.

Column 14, line 21, change "Inp" to --InP--.

Column 15, line 40, change "($p^{30}$-n" to --($p^+$-n--.

Column 16, line 37, change "2000 A Au-Zn" to --2000 A thick Au-Zn--.

Column 16, line 38, between "and" and "2000" insert --a--.

Column 17, line 49, change "p+-type layer was" to --p+-type layer was--.

UNITED STATES PATENT AND TRADEMARK OFFICE
CERTIFICATE OF CORRECTION

PATENT NO. : 4,591,654

DATED : May 27, 1986

INVENTOR(S) : M. Yamaguchi, et al.

It is certified that error appears in the above-identified patent and that said Letters Patent is hereby corrected as shown below:

Column 17, line 61, change "irradiate" to --irradiated--.

Column 18, line 44, change "$p^{30}$" to --$p^{+}$--.

Column 19, line 13, change "$10 cm^3$" to --$10^{19} cm^3$--.

Column 20, line 30, change "$Ga_x In_{1xx} P$" to --$Ga_x In_{1-x} P$--.

Signed and Sealed this

Thirteenth Day of January, 1987

Attest:

DONALD J. QUIGG

*Attesting Officer*     *Commissioner of Patents and Trademarks*